United States Patent [19]

Gill

[11] Patent Number: 4,994,403

[45] Date of Patent: Feb. 19, 1991

[54] METHOD OF MAKING AN ELECTRICALLY PROGRAMMABLE, ELECTRICALLY ERASABLE MEMORY ARRAY CELL

[75] Inventor: Manzur Gill, Rosharon, Tex.

[73] Assignee: Texas Instruments Incorporated, Dallas, Tex.

[21] Appl. No.: 457,990

[22] Filed: Dec. 28, 1989

[51] Int. Cl.[5] .......................................... H01L 29/788
[52] U.S. Cl. ........................................ 437/43; 437/48; 437/49; 437/50; 437/52; 437/61; 357/23.5
[58] Field of Search ................... 437/43, 48, 49, 50, 437/52, 61; 357/23.5

[56] References Cited

U.S. PATENT DOCUMENTS

| | | | |
|---|---|---|---|
| 4,317,273 | 3/1982 | Guterman et al. | 437/43 |
| 4,372,031 | 2/1983 | Tsaur et al. | 437/43 |
| 4,379,343 | 4/1983 | Moyer | 357/23.5 |
| 4,672,409 | 1/1987 | Takei et al. | 357/23.5 |
| 4,750,024 | 6/1988 | Schreck | 357/23.5 |
| 4,803,529 | 2/1989 | Masuoka | 357/23.5 |
| 4,804,637 | 2/1989 | Smayling et al. | 437/52 |
| 4,892,840 | 1/1990 | Esquivel et al. | 437/48 |
| 4,912,676 | 3/1990 | Paterson et al. | 357/23.5 |

Primary Examiner—Brian E. Hearn
Assistant Examiner—Gordon V. Hugo
Attorney, Agent, or Firm—W. James Brady, III; James T. Comfort; Melvin Sharp

[57] ABSTRACT

A pair of electrically erasable, electrically programmable memory cells are formed at a face of a semiconductor layer (10) and include respective drain regions (30a, 30b), a shared source region (28) and respective channel regions (38a, 38b). Each cell has a floating gate conductor (46a, 46b) which may be programmed by hot electron injection and erased by Fowler-Nordheim electron tunneling through respective tunneling oxide windows (40a, 40b) overlying a portion of source region (28) adjacent respective channels (38a, 38b). A wordline or control gate conductor (62) is insulatively disposed adjacent the floating gates (46a, 46b) to program or erase.

4 Claims, 5 Drawing Sheets

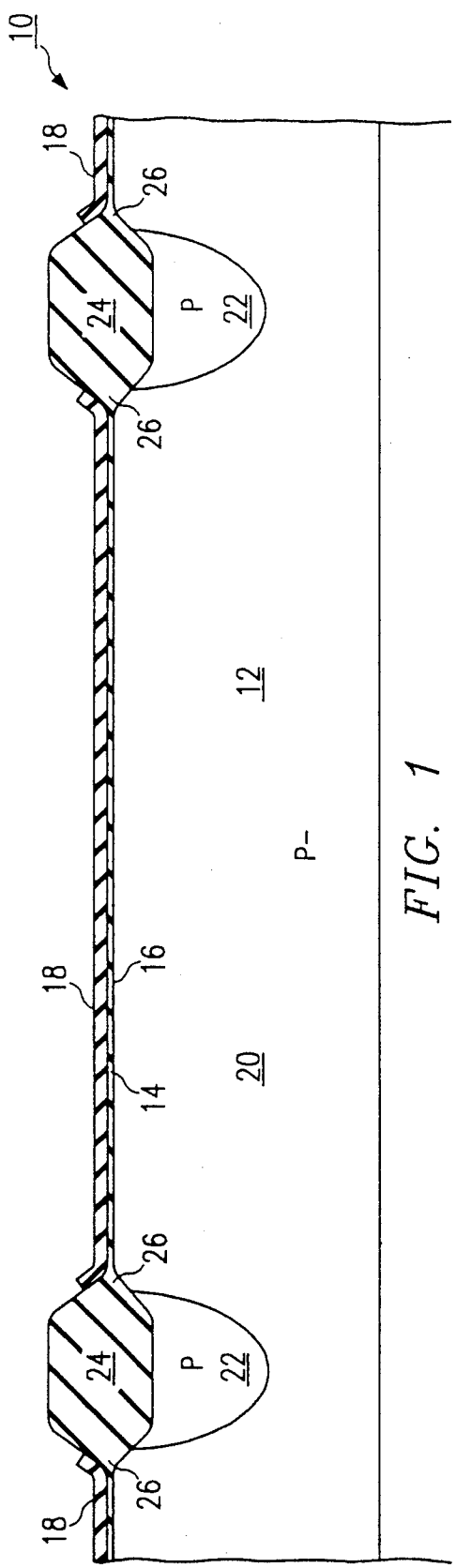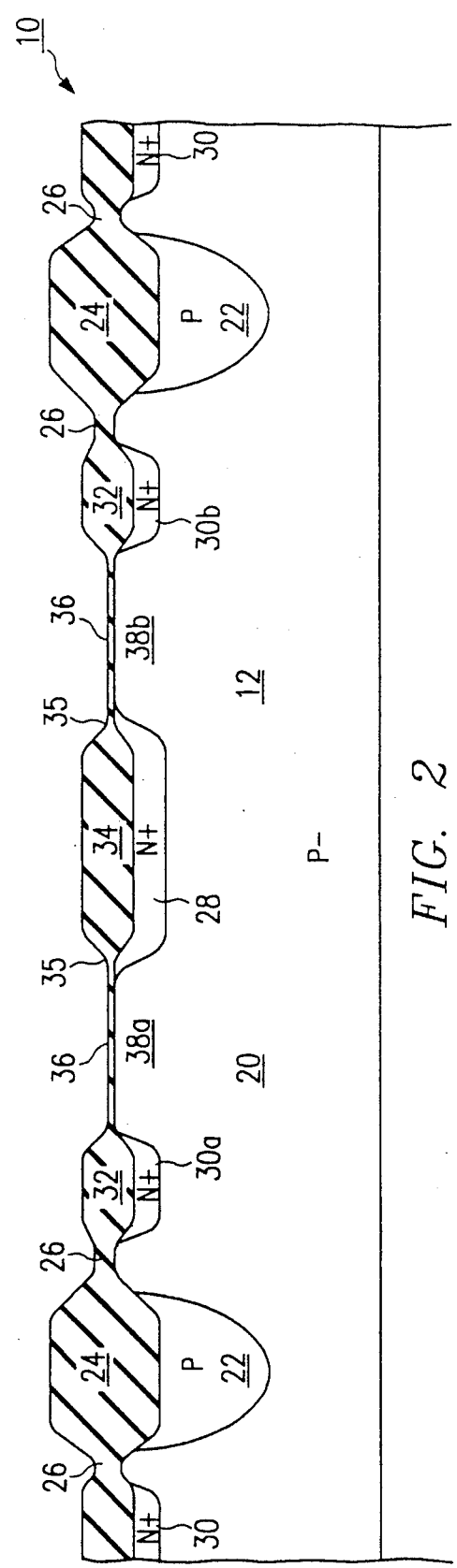

METHOD OF MAKING AN ELECTRICALLY PROGRAMMABLE, ELECTRICALLY ERASABLE MEMORY ARRAY CELL

RELATED APPLICATIONS

This application discloses subject matter also disclosed in co-pending U.S. patent application Ser. No. 07/219,529 filed July 15, 1988; Ser. No. 07/219,528 filed July 15, 1988; Ser. No. 07/458,936filed Dec. 29, 1989, and Ser. No. 07/219,530 filed July 15, 1988, all assigned to Texas Instruments Inc., the assignee of this invention. These related applications are incorporated by refer-

TECHNICAL FIELD OF THE INVENTION

The present invention relates generally to integrated circuits, and more particularly electrically erasable and programmable read only memories (EEPROMs) and methods of manufacture and use of such devices.

BACKGROUND OF THE INVENTION

An EEPROM, or electrically-erasable and programmable read only memory, uses field effect transistors with a floating gate structure in which a programmed charge can be stored on an electrically isolated floating gate to control the threshold voltage $V_T$. A read operation differentiates between the impedance presented by a charged (high $V_T$) gate and an uncharged (low $V_T$) gate, thereby differentiating between logic states of the memory cell. EEPROMs are erasable either cell-by-cell, or in a flash-erase mode in which the entire memory array is erased.

EEPROMs use either of two charge transfer mechanisms for programming—Fowler-Nordheim tunneling or hot electron injection. Fowler-Nordheim tunneling is generally used for erasing. EEPROMs using hot electron injection for programming typically employ FAMOS or floating-gate, avalanche-injection MOS, although hot electron injection results from channel hot electrons as well as avalanche breakdown (assuming NMOS devices).

Both charge transfer mechanisms have advantages and disadvantages. Programming an EEPROM memory cell by hot electron injection requires lower voltage than does Fowler-Nordheim tunneling. On the other hand, the higher voltages required for Fowler-Nordheim tunneling can be generated on-chip because of the very low tunneling current requirements for programming. In contrast, an additional power supply is required for FAMOS-type EEPROMs because of high programming current requirements. Moreover, floating gate erasure using injection of hot holes is disadvantageous, however, in that these carriers can damage the oxide insulator layer, eventually leading to cell degradation and failure. Using a Fowler-Nordheim tunnel current to erase a floating gate results in significantly less damage to the tunnel window oxide, and therefore is advantageous in terms of memory cell durability and reliability.

EEPROMs using hot electron injection for programming and Fowler-Nordheim tunneling for erasure have been described in: (a) "A Single Transistor EEPROM Cell and its Implementation in a 512K CMOS EEPROM," S. Mukherjee et al., IEDM 1985 (p. 616–619), (b) "An In-System Reprogrammable 256K CMOS Flash Memory", V. N. Kynett et al., ISSCC 1988 (p. 132–133); and (c) "A 128K Flash EEPROM Using Double Polysilicon Technology," George Samachisa et al., ISSCC 1987 (p. 87–88). These EEPROMs employ conventional architecture where the drains of two memory cells share one contact.

FAMOS gate oxide thickness is a trade-off between adequate tunneling current for erase in a reasonable time, and the impact on yields/reliability from processing defects. That is, thick gate oxide improves process yields/reliability, but reduces tunnel current leading to long erase times. Moreover, gated junction breakdown voltage is degraded with thin gate oxide, so that, during erase, excessive junction leakage (and the unwanted generation of hot electrons) can occur before the onset of adequate Fowler-Nordheim tunnel erase current. (See References (b) and (c)). Thus, these EEPROMs are erased, in part, by hot holes because of low field plate breakdown voltage of the FAMOS source junction.

The approach in Reference (c) uses channel oxide of about 200 angstroms, and uses channel hot electron injection for programming, and Fowler-Nordheim tunneling for erasure from the same junction. It has two disadvantages: (i) the junction optimization requirements for erasing/programming are incompatible, and cannot be met by the same junction; and (ii) a gate oxide thickness of 200 angstroms does not allow adequate Fowler-Nordheim tunneling current for erasing in a reasonable erase time with conventional 12.5 volt EEPROM power supplies. As a result, junction breakdown assisted erase can occur leading to excessive substrate current during erase.

Thus, EEPROMs heretofore have not combined hot electron injection programming with strictly Fowler-Nordheim tunnel erasing. One problem is that the higher voltages required by Fowler-Nordheim tunnel erasing lead to source junction field plate breakdown, and the unwanted generation of hot holes. The related application Ser. No. 07/219,529, discloses a memory cell configuration in which a Fowler-Nordheim tunnel window is located on a side of the source opposite the channel, and the junction under the tunnel window terminates under a relatively thick oxide, thereby improving source junction field plate breakdown.

Accordingly, a need exists for an EEPROM that is programmed using only hot carrier injection, and is erased using only Fowler-Nordheim tunneling, in a contactless array configuration. Such an EEPROM would take advantage of the relatively low voltage required for hot electron injection programming while avoiding channel insulator damage due to hot hole erasure, thereby improving the durability and reliability of the memory cell, and the reduced number of array contacts would provide improved process yields (further improving reliability). In general, a satisfactory memory cell of this type would provide careful control over the channel and junction profile to achieve optimum efficiency for the hot carrier injection programming operation.

Flash EEPROMs have the advantage of smaller cell size in comparison with standard EEPROMs because the cells are not erased individually. Instead, the array of cells may be erased in bulk or by blocks of cells.

SUMMARY OF THE INVENTION

According to the invention, a source region is formed in a semiconductor layer of a first conductivity type to be of a second conductivity type opposite to that of the first. First and second drain regions of the second conductivity type are formed in the semiconductor layer on opposite sides of the source region. The first drain region is spaced from the source region to define a first channel region. The second drain region is spaced from the source region to define a second channel region.

A first thin tunneling window is formed overlying a portion of the source region adjacent to the first channel region. A second thin tunneling window is formed overlying a portion of the source region adjacent to the second channel region.

A first floating gate conductor is formed over the first thin tunneling window and over the first channel region. A second floating gate is formed over the second thin tunneling window and the second channel region. A control gate conductor is formed insulatively adjacent both the floating gate conductors to complete the formation of a first and a second memory cell with common source region.

To program a selected cell, a first voltage (a low voltage or ground) is applied to the source. The drain of the selected cell is brought to a positive voltage (5-12.5 V). A higher voltage (8-12 V volts) is applied to the control gate. The floating gate is then charged via hot electron injection.

To erase a selected cell, a positive voltage (approximately +5 volts) is applied to the source. The drain of the selected cell is left floating. The control gate is brought to a high negative voltage (−8 to −12 V) which causes the floating gate to be erased via Fowler-Nordheim tunneling using the thin tunneling window.

The present invention presents distinct advantages over prior art flash-erasable EEPROMs. The arrays are formed using a simple process which requires the formation of only two layers of polycrystalline silicon conductors. The formation of the floating gate conductors over portions of the buried common source region, over all of the respective buried drain regions, and over portions of respective adjacent isolating field oxide regions increases the capacitive coupling between the floating gate conductors and the control gate conductor. Additionally, the arrays are contactless. Further, since the erase and program junctions are separate, each junction can be optimized independently.

Finally, by using hot electron injection for programming and Fowler-Nordheim tunneling for erasing, the present invention takes advantage of the relatively low voltage required for hot electron injection programming while avoiding channel insulator damage due to hot hole erasure, thereby improving the reliability and durability of the memory cell.

BRIEF DESCRIPTION OF THE DRAWINGS

Other aspects of the invention and their advantages will be discerned when one refers to the following detailed description as taken in conjunction with the drawings, in which:

FIGS. 1-6 are greatly enlarged schematic elevational sectional views of a semiconductor layer showing progressive stages in the fabrication of a pair of EEPROM cells according to the invention;

FIG. 7 is a plan view of a section of a memory cell array, the sectional view of FIG. 6 taken substantially along line 6—6;

FIG. 8 is a sectional view taken substantially along line 8—8 of FIG. 6;

FIG. 9 is a sectional view of FIG. 6 taken substantially along line 9—9 of FIG. 6; and FIG. 10 is an electrical schematic diagram of a small section of an array of cells according to the invention.

DETAILED DESCRIPTION OF THE INVENTION

The fabrication of a pair of EEPROM cells according to the invention will be described first, followed by the operation of an array of such cells.

Referring first to FIG. 1, a semiconductor substrate or layer 10 is shown having a (p−) epitaxial layer 12 grown thereon. A layer 14 of oxide is deposited or grown on the surface 16 of (p−) region 12. This is followed by the deposition of a nitride layer 18 on top of the oxide layer 14. The nitride layer 18 is patterned and etched to define an active device area 20 over which it resides, which will later include a source region, two drain regions and two channel regions of a pair of EEPROM cells.

The fabrication process detailed herein omits steps necessary for the cofabrication of a plurality of CMOS logic transistors sited in the periphery of the chip. Since the techniques for fabricating such transistors are conventional, they will not be described here.

A boron implant at a dose of approximately $8 \times 10^{12}$ cm$^{-2}$ is performed to create (P) channel stop regions 22 and corresponding (P) channel stop regions 63 under oxide regions 65a and 65b (see FIGS. 7-9). Then, thick field oxide regions 24 and thick oxide regions 65a and 65b (see FIGS. 7-9) are thermally grown using a localized oxidation process to a thickness of approximately 9,000 angstroms by exposing the substrate to steam at about 900° C. for several hours using any of several conventional techniques. The thermal oxide regions 24 grow beneath the edges of adjacent nitride layers 18, creating bird's beaks 26 instead of sharp transitions.

Referring next to FIG. 2, nitride layer 18 and oxide layer 14 are removed. A layer (not shown) of photoresist is deposited and patterned to act as an implant mask for an arsenic implant at a dose of about $6 \times 10^{15}$cm$^{-2}$ and at an energy of about 135 KeV. This implant creates a source region 28 and a pair of drain regions 30a and 30b inside the active device area 20.

In a preferred embodiment, the photoresist is patterned such that areas of the bird's beaks adjacent the future source/drain regions are left exposed. An etch is next performed to reduce these bird's beaks of the isolating oxide regions 24 and the regions 65a and 65b (see FIGS. 7-9). The arsenic implant is performed thereafter using the same patterned photoresist. This etch prior to implant allows a true self-alignment of the n+ drain regions 30a and 30b to the edges of the isolating oxide regions 24. This prior etch step results in a wider N+ region length for the same overall geometry, and therefore makes the cell more scaleable.

Following the arsenic implant, an additional phosphorous implant of a dose of approximately $10^{13}$ to $10^{14}$cm$^{-2}$ is performed adjacent source region 28 such that a phosphorous junction will extend beyond the subsequently created thin oxide tunneling windows. As will be later explained in conjunction with FIG. 7, each active device area 20 is an elongate column of cells containing several pairs of EEPROM cells. Only one complete pair of such cells is shown in the section taken in FIGS. 1 through 6.

Following the implant of the source region 28 and the drain regions 30a and 30b, another thermal step is performed with steam at 800°-900° C. to differentially grow oxide regions 32 and 34. The thick oxide regions 32 and 34 will be grown to a thickness of approximately 2,500 to 3,500 angstroms with oxide region 34 having transition regions 35. At the same time, a thinner oxide layer 36 is formed between the source region 28 and the drain regions 30a and 30b and may have a thickness of approximately 200-300 angstroms. The oxidation step may be adjusted to change the thickness of the oxide 36, and therefore the final thickness of the gate oxide as described below. The oxide regions 32 and 34 define the lateral limits of a pair of channel regions 38a and 38b.

Referring next to FIG. 3, windows are opened in the oxide in the transition areas 35 of oxide region 34. This is done by masking all surfaces except oxide layer 34 and immediately adjacent future window regions 40a and 40b, and etching the oxide layer 34 until the source region 28 is exposed in these window areas 40a and 40b, removing transition areas 35. The width of the tunnel windows 40a and 40b may be controlled by varying the length of time for the etch through the transition areas 35. A thinner window oxide is regrown for the tunnel windows 40a and 40b that are approximately 100 angstroms thick. At the time that this oxidation occurs, the gate oxide layer 36 will grow to approximately 350 angstroms, depending on its thickness before this step, which may be adjusted as described above.

Referring next to FIG. 4, a layer 42 of polycrystalline silicon (polysilicon) is deposited to a thickness of approximately 3,500 angstroms. The polysilicon layer 42 (also known as the "poly 1" layer) is highly doped to render it conductive. This may be accomplished, for example, by applying an (n+) dopant to the polysilicon layer 42 after it has been deposited.

The poly 1 layer 42 is next patterned and etched, followed by a self-aligned plasma etch of the polysilicon layer 42 to partially define first and second floating gate conductors 46a and 46b. This etching step defines the floating gate conductors 46a and 46b in an x-direction only, where x is coplanar with the section shown. In a y-direction perpendicular to the paper, the conductors 46a and 46b exist at this point as long contiguous parallel strips stretching over every pair of cells in the same column as the illustrated cells. The definition of the conductors 46a and 46b in a y-direction takes place in a stack etch described below.

After removing the photoresist, sidewall oxide is formed at the exposed poly 1 edges by a conventional method. This is followed by the formation of a relatively thin interlevel insulator layer 44 such as an oxide/nitride/oxide (ONO) sandwich, using conventional techniques.

Referring next to FIG. 5, a second polycrystalline silicon layer 62 ("poly 2") is next deposited over the face of the slice and is highly doped to be (n+). The polysilicon layer is deglazed. Next, a stack etch of (1) the second polysilicon layer 62, (2) the interlevel insulator layer(s) 44, and (3) the first poly conductors 46a and 46b is performed. This stack etch defines a plurality of elongated word line conductors 62 that run substantially parallel to each other in an x-direction and are spaced apart from one another in a y-direction. This same stack etch separates and defines the floating gate conductors 46a and 46b in a y-direction. Peripheral logic CMOS devices (not shown) may be completed after this step. An oxide layer 64 is grown after this process on the sides and top of the stack for enhanced data retention.

A borophosphosilicate glass (BPSG) layer 66 has been deposited over the face of the wafer. Off-array contacts (not shown) are made through the BPSG layer 66, as are on-array contacts (not shown) that are made from metal bit lines (not shown) to respective diffused regions 30a, 30b and 28 periodically in a y-direction. The metal bit lines are formed on the BPSG layer 66 to run over and be parallel to respective diffused regions 30a, 28 and 30b.

Referring next to FIG. 7, a plan view of an EEPROM memory cell array is shown, with the sectional view shown in FIG. 6 taken substantially along line 6—6 of FIG. 7. FIG. 7 only depicts a portion of the memory array; selected structure of the array has been omitted for the sake of clarity.

The drain regions 30a and 30 b are elongated diffused bit lines that run in a vertical (y) direction in FIG. 7. These drain regions are buried under oxide regions 32. The floating gate conductors are shown at 46a and 46b. Also shown are the placement of tunnel windows 40a and 40b, and channel regions 38a and 38b.

Two control gate conductors 62 are shown. Control gate conductors 62 are elongated in a horizontal (x) direction and each form a word line for a row of cells.

FIG. 8 is a sectional view taken substantially along line 8—8 of FIG. 7, while FIG. 9 is a sectional view taken substantially along line 9—9 of FIG. 7. FIG. 8 shows the oxide isolation between source and drain regions outside of the cell areas, and FIG. 9 shows oxide isolation between adjacent channel regions 38a in a column direction.

FIG. 10 is an electrical schematic diagram of six pairs of EEPROM cells. In FIGS. 1-10, like characters identify like parts so that the structural components of the EEPROM cells and their electrical representations may be compared. Each row of cells is provided with a word line conductor WL0 or WL1. Each column of cell pairs is provided with two bit lines such as BL0 and BL1. Each column of cells further has a source connection 28. The conductances of channel regions 38a and 38b are respectively controlled by the floating gate conductors 46a and 46b, and the control gate 62.

Using cell (1,1) as designated in FIG. 10 as an example, the Table set forth below shows the write, read and erase modes of an array of memory cells according to the invention. Voltages used in the respective modes are described in the Table.

TABLE

| | READ, WRITE AND ERASE VOLTAGES | | | | | | | | |
|---|---|---|---|---|---|---|---|---|---|
| | WL0 | WL1 | WL2 | BL0 | BL1 | BL2 | BL3 | Selected Source | Deselected Source |
| Write (Program) Bit (1,1) | Vss (~0 V) | VGG (+8 to 12 V) | Vss (~0 V) | Float | VPP (5 to 12.5 V) | Float | Float | Vss (~0 V) | Vss (~0 V) |
| Read Bit (1,1) | Vss (~+0 V) | Vse (~+5 V) | Vss (~+0 V) | Vss (~+0 V) | Vrd (~+1.5 V) | Vss (~0 V) | Vss (~0 V) | Vss (~0 V) | Vss (~0 V) |
| Flash Erase Alt. 1 | −Vee (−8 to −12 V) | −Vee (−8 to −12 V) | −Vee (−8 to −12 V) | Float | Float | Float | Float | VDD (~+5 V) | VDD (~+5 V) |

TABLE-continued

READ, WRITE AND ERASE VOLTAGES

| | WL0 | WL1 | WL2 | BL0 | BL1 | BL2 | BL3 | Selected Source | Deselected Source |
|---|---|---|---|---|---|---|---|---|---|
| Alt. 2 | Vss (~0 V) | Vss (~0 V) | Vss (~0 V) | Float | Float | Float | Float | Ve (~ +12.5 V) | Ve (~ +12.5 V) |

In the write or program mode, source column decoder 88 applies a low voltage Vss (approximately 0 volts) or ground to the source column 28 of the selected cell, in this case cell (1,1). Drain column decoder 90 operates to apply a voltage Vpp(5-12.5) to the drain column 30 (bitline) of the selected cell in this example BL1. Drain column decoder 90 operates to allow all deselected drain columns (bitlines) 30, in this case BL0, BL2 and BL3, to float. Row column decoder 92 applies a high voltage Vgg (8-12 V) to the selected row (wordline), in this case designated WL1, while a lower voltage Vss (approximately 0 V) is applied to the deselected rows, in this case WL0 and WL2. The voltage differences created between source 28, drain 30 and control gate 62 of cell (1,1) result in floating gate 46 being charged through hot electron injection thereby programming the cell.

To read cell (1,1), drain column decoder 90 applies a positive voltage Vrd (approximately +1.5 V) to selected drain column (bitline) BL1. All source columns 28 are brought to Vss (approximately 0 volts) or ground by source column decoder 88. Row decoder 92 applies a positive voltage Vse (approximately +5 volts) to selected row (wordline) WL1 and a low voltage (either ground or Vss) to deselected rows WL0 and WL2.

In a first mode of flash or bulk erasing, source column decoder 88 applies a positive voltage VDD (approximately +5 V) to all source columns 28. The drain column decoder 90 allows all drain columns (bitlines) 30 to float. Row decoder 92 applies a high negative voltage −Vee (−8 to −12 V) to all row lines (wordlines) 62, in this case WL0, WL1 and WL2. The resulting voltage differentials cause a removal of charge from floating gates 46 through Fowler-Nordheim tunneling, erasing the array.

In a second mode of flash or bulk erasing, source column decoder 88 applies a large positive voltage Ve (approximately +12.5 volts) to all source columns 28. The drain column decoder 90 allows all drain columns (bitlines) 30 to float. Row decoder 92 applies a small voltage (approximately 0 volts) to all row lines (wordlines) 62, in this case WL0, WL1 and WL2. The resulting voltage differences cause discharge of floating gates 46 through Fowler-Nordheim tunneling, erasing the array.

While preferred embodiments of the invention and their advantages has been set forth in the above detailed description, the invention is not limited thereto but only by the scope and spirit of the appended claims.

What is claimed is:

1. A method for fabricating at least first and second electrically erasable and programmable memory cells at a face of a semiconductor layer having a first conductivity type, comprising the steps of:
    selectively doping the semiconductor layer with a dopant of a second conductivity type opposite the first conductivity type to create a drain region of the first cell, a shared source region spaced from the drain region of the first cell by a channel region of the first cell, and a drain region of the second cell spaced from the source region by a channel region of the second cell;
    differentially growing an insulator layer over the face to create thick insulator regions over the source and drain regions, and a relatively thin insulator layer in between the source region and the drain regions;
    selectively removing the thin insulator layer to expose first and second window areas on the source region adjacent the channel regions of the respective first and second cells;
    forming a first conductive layer over the face;
    selectively etching the first conductive layer to define first and second floating gate conductors, each formed over a respective thin window insulator and the channel adjacent the respective thin window insulator; and
    forming a control gate conductor insulatively adjacent the floating gate conductors.

2. The method of claim 1, and further comprising the steps of:
    after said step of forming the first conductive layer over the face, forming an oxide layer on the first conductive layer;
    forming a nitride layer on the oxide layer; and
    forming a second oxide layer on the nitride layer to create a three-insulator oxide-nitride-oxide layer.

3. The method of claim 1, wherein the first and second cells are formed within an array of such cells formed in parallel rows and columns formed at an angle to the rows, the method further comprising:
    selectively etching the first conductive layer to form spaced apart columnar strips, each group of two adjacent strips including first and second floating gate conductor strips;
    forming a second conductive layer over the face; and
    etching the second conductive layer and the floating gate conductor strips to define a control gate conductor for each row that is elongate in a row direction and a plurality of floating gate conductors having edges in a row direction that are aligned with the edges in the row direction of respective control gate conductors.

4. The method of claim 3, and further comprising the steps of:
    during the step of etching the second conductive layer and the floating gate conductor strips, exposing regions of the semiconductor layer;
    doping the exposed regions with a dopant of a first conductivity type to form doped regions in the semiconductor layer; and
    forming a thick oxide layer over the doped regions.

* * * * *